(12) United States Patent
Miki et al.

(10) Patent No.: US 8,389,313 B2
(45) Date of Patent: Mar. 5, 2013

(54) DEPOSITION METHOD OF III GROUP NITRIDE COMPOUND SEMICONDUCTOR LAMINATED STRUCTURE

(75) Inventors: Hisayuki Miki, Ichihara (JP); Kenzo Hanawa, Ichihara (JP); Yasumasa Sasaki, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 12/299,082

(22) PCT Filed: Sep. 13, 2007

(86) PCT No.: PCT/JP2007/068324
§ 371 (c)(1),
(2), (4) Date: Oct. 30, 2008

(87) PCT Pub. No.: WO2008/041499
PCT Pub. Date: Apr. 10, 2008

(65) Prior Publication Data
US 2009/0087936 A1      Apr. 2, 2009

(30) Foreign Application Priority Data

Sep. 29, 2006 (JP) ................... 2006-268438
Oct. 6, 2006 (JP) ................... 2006-274896
Oct. 6, 2006 (JP) ................... 2006-275485

(51) Int. Cl.
*H01L 21/00* (2006.01)
(52) U.S. Cl. ............... 438/46; 438/22; 438/477; 257/82; 257/94
(58) Field of Classification Search ............ 438/22, 438/46, 477, 681; 257/82, 94
See application file for complete search history.

(56) References Cited

U.S. PATENT DOCUMENTS 4,782,032 A * 11/1988 Geissberger et al. ......... 438/181
5,122,845 A     6/1992 Manabe et al.
5,290,393 A     3/1994 Nakamura
(Continued)

FOREIGN PATENT DOCUMENTS

CN      1270420 A       10/2000
EP      1296363 A1      3/2003
(Continued)

OTHER PUBLICATIONS

Kikuma, et al., "GaN films deposited by planar magnetron sputtering," Vacuum, 2002, p. 233-237, vol. 66.
(Continued)

*Primary Examiner* — Phuc Dang
(74) *Attorney, Agent, or Firm* — Sughrue Mion, PLLC

(57) ABSTRACT

The present invention provides a deposition method of a multilayered structure composed of a III group nitride compound semiconductor having good crystallinity on a substrate. The multilayered structure comprises at least a buffer layer and an underlying layer from the substrate side, and the buffer layer and the underlying layer are formed by a sputtering method. A deposition temperature of the buffer layer is adjusted to a temperature lower than a deposition temperature of the underlying layer, or the thickness of the buffer layer is adjusted to 5 nm to 500 nm. Furthermore, the multilayered structure comprises at least an underlying layer and a light-emissive layer from the substrate side and the underlying layer is formed by a sputtering method, and the method comprises the step of forming the light-emissive layer by a metal-organic chemical vapor deposition (MOCVD method).

12 Claims, 2 Drawing Sheets

U.S. PATENT DOCUMENTS

| | | |
|---|---|---|
| 6,713,789 B1 | 3/2004 | Shibata et al. |
| 6,830,949 B2 * | 12/2004 | Senda et al. ............... 438/46 |
| 6,939,733 B2 * | 9/2005 | Shibata et al. ............. 438/48 |
| 7,289,183 B2 * | 10/2007 | Gan et al. ................. 349/147 |
| 2002/0047203 A1 * | 4/2002 | Akahori et al. ............ 257/753 |
| 2002/0132487 A1 | 9/2002 | Lee et al. |
| 2003/0109076 A1 | 6/2003 | Senda et al. |
| 2004/0209390 A1 * | 10/2004 | Senda et al. ............... 438/46 |
| 2005/0158585 A1 * | 7/2005 | Takahashi et al. ........ 428/694 T |
| 2006/0094145 A1 | 5/2006 | Otsuka et al. |
| 2006/0269729 A1 * | 11/2006 | Gan et al. .................. 428/209 |
| 2007/0080369 A1 * | 4/2007 | Sakai ......................... 257/103 |
| 2007/0246802 A1 * | 10/2007 | Xianyu et al. ............. 257/637 |

FOREIGN PATENT DOCUMENTS

| | | |
|---|---|---|
| JP | 60-039819 A | 3/1985 |
| JP | 04-297023 A | 10/1992 |
| JP | 05-086646 B2 | 12/1993 |
| JP | 3026087 B2 | 1/2000 |
| JP | 2001-094150 A | 4/2001 |
| JP | 2001168471 A | 6/2001 |
| JP | 2001-308010 A | 11/2001 |
| JP | 3440873 B2 | 6/2003 |
| JP | 2003-188414 A | 7/2003 |
| JP | 3700492 B2 | 7/2005 |
| TW | 447149 B | 7/2001 |
| TW | 1240969 B | 10/2005 |
| WO | 2004/109782 A1 | 12/2004 |

OTHER PUBLICATIONS

Ushiku, et al., Collected Papers of 21st Century Combined Symposium, 2003, p. 295-298, vol. 2.

H. Tang, et al.; "Structure characterization of AlN buffer layers grown on (0 0 0 1) sapphire by magnetron sputter epitaxy"; Journal of Crystal Growth; vol. 244, No. 1; Sep. 1, 2002; pp. 1-5; XP004378911.

P. Singh, et al.; "Growth and characterization of GaN thin films by magnetron sputter epitaxy"; Journal of Vacuum Science and Technology; Part A; vol. 16, No. 2; Mar. 1, 1998; pp. 786-789; XP012003857.

* cited by examiner

DEPOSITION METHOD OF III GROUP NITRIDE COMPOUND SEMICONDUCTOR LAMINATED STRUCTURE

TECHNICAL FIELD

The present invention relates to a deposition method of a III group nitride compound semiconductor (hereinafter, the III group nitride compound semiconductor is represented by InGaAlN) laminated structure having good crystallinity used to produce light emitting diodes (LED), laser diodes (LD) and electronic devices. More specifically, the present invention relates to a deposition method of a III group nitride compound semiconductor laminated structure, which can be preferably used in the epitaxial growth of a III group nitride compound semiconductor crystal having good crystallinity on a sapphire substrate.

BACKGROUND ART

A III group nitride compound semiconductor has an energy direct transition-type bandgap corresponding to a visible to ultraviolet radiation range and can emit light with high efficiency, and is therefore manufactured as an LED and LD. The III group nitride compound semiconductor also has a potential to provide characteristics that are not obtained by a conventional III-V group compound semiconductor.

Generally, the III group nitride compound semiconductor is produced by an organic metal-organic chemical vapor deposition (MOCVD) method using trimethyl gallium (TMG), trimethyl aluminum (TMA) and ammonia ($NH_3$) as raw materials. The MOCVD method is a method in which a carrier gas is mixed with vapor of a raw material and the mixture is transported onto the surface of a substrate, and then the raw material is decomposed by a reaction with the heated substrate, and thus crystal growth occurs.

A single crystal wafer of the II group nitride compound semiconductor is not commercially available and a method of growing a crystal of the III group nitride compound semiconductor on a single crystal wafer made of a different material is commonly used. There is a large lattice mismatch between a different type of a substrate and the III group nitride compound semiconductor crystal, which is epitaxially grown on the substrate. For example, 16% of the lattice mismatch exists between sapphire ($Al_2O_3$) and gallium nitride (GaN), while 6% of the lattice mismatch exists between SiC and gallium nitride. When such a large lattice mismatch exists, it is difficult to epitaxially grow the crystal directly on the substrate and a good crystal cannot be obtained even when epitaxial growth is performed. Therefore, when a III group nitride compound semiconductor crystal is epitaxially grown on a sapphire single crystal substrate or a SiC single crystal substrate by an organic metal-organic chemical vapor deposition (MOCVD) method, as disclosed in Japanese Patent No. 3,026,087 and Japanese Unexamined Patent Publication (Kokai) No. 4-297023, a method has been used of firstly stacking a layer called a low-temperature buffer layer composed of aluminum nitride (AlN) or aluminum gallium nitride (AlGaN) on a substrate and then epitaxially growing a III group nitride compound semiconductor crystal thereon at a high temperature.

Some reports have been made with respect to a technique of forming, as a buffer layer, a layer of AlN using a method other than a MOCVD method and forming another layer using a MOCVD method. For example, Japanese Examined Patent Publication (Kokoku) No. 5-86646 describes a technique of using a MOCVD method to grow a crystal with the same composition on a buffer layer formed by RF sputtering. However, Japanese Patent No. 3440873 and Japanese Patent No. 3,700,492 describes that a good crystal cannot be safely obtained only by the technique described in Japanese Examined Patent Publication (Kokoku) No. 5-86646. In order to stably obtain a good crystal, Japanese Patent No. 3,440,873 described that a buffer layer is annealed in a mixed gas of ammonia and hydrogen after growing the buffer layer, and Japanese Patent No. 3,700,492 describes that it is important that a buffer layer is formed by DC sputtering at a temperature of 400° C. or higher.

Research into producing a III group nitride compound semiconductor crystal by sputtering has been carried out. For example, Japanese Unexamined Patent Publication (Kokai) No. 60-39819 describes that a layer of GaN is directly formed on a substrate by sputtering for the purpose of laminating a GaN having high resistance. The conditions used are as follows: attainable pressure: $5 \times 10^{-7}$ to $10^{-8}$ Torr, gas circulating in chamber: Ar and $N_2$, gas pressure during sputtering: 3 to $5 \times 10^{-2}$ Torr, RF voltage: 0.7 to 0.9 kV (power: 20 to 40 W), distance between substrate and target: 20 to 50 mm, and substrate temperature: 150 to 450° C. However, it is not an object of these applications to produce an underlying layer of a light emitting device and there is no description concerning the deposition of a layer on the film.

Collected Papers of 21st Century Combined Symposium, Vol. 2nd, p 295 (2003) describe that a GaN film was formed on Si (100) and $Al_2O_3$ (0001) by high-frequency magnetron sputtering using an $N_2$ gas. The deposition conditions are as follows: total gas pressure: 2 m Torr, power: 100 W, and substrate temperature: ranging from room temperature to 900° C. According to the figures in the document, a target is opposed to a substrate in an apparatus used.

In Vacuum, Vol. 66, p 233 (2002), a layer of GaN is formed using an apparatus wherein a cathode is opposed to a target and a mesh is interposed between a substrate and a target. In this document, the deposition conditions are as follows: pressure in $N_2$ gas: 0.67 Pa, substrate temperature: 84 to 600° C., power: 150 W, and distance between substrate and target: 80 mm.

DISCLOSURE OF THE INVENTION

A first object of the present invention is to stably obtain a III group nitride compound semiconductor layer having good crystallinity using a sputtering method as a technique capable of obtaining a crystal film having good uniformity with a short time when a III group nitride compound semiconductor layer is formed.

In order to achieve the above object, the present invention provides the following inventions (1) to (12)
(Solution Means I)
(1) A deposition method of a multilayered structure composed of a III group nitride compound semiconductor on a substrate, characterized in that: the multilayered structure comprises at least a buffer layer and an underlying layer from the substrate side, the buffer layer and the underlying layer are laminated by a sputtering method, and a deposition temperature of the buffer layer is adjusted to a temperature is adjusted to a temperature lower than a deposition temperature of the underlying layer.
(2) The deposition method of a III group nitride compound semiconductor laminated structure according to the above-described (1), wherein the buffer layer contains Al.
(3) The deposition method of a III group nitride compound semiconductor laminated structure according to the above-described (2), wherein the buffer layer is formed of AlN.

(4) The deposition method of a III group nitride compound semiconductor laminated structure according to the above-described (2) or (3), wherein the buffer layer is formed of an aggregate of a columnar crystal.
(5) The deposition method of a III group nitride compound semiconductor laminated structure according to any one of the above-described (2) to (4), wherein at least 60% of the substrate is coated with the buffer layer.
(6) The deposition method of a III group nitride compound semiconductor laminated structure according to any one of the above-described (2) to (5), wherein the buffer layer has a thickness of 20 to 100 nm.
(7) The deposition method of a III group nitride compound semiconductor laminated structure according to the above-described (1), wherein the underlying layer contains Ga.
(8) The deposition method of a III group nitride compound semiconductor laminated structure according to the above-described (7), wherein the underlying layer is formed of GaN.
(9) The deposition method of a III group nitride compound semiconductor laminated structure according to any one of the above-described (1) to (3), (7) and (8), wherein the buffer layer is formed of AlN and the underlying layer is formed of GaN.
(10) The deposition method of a III group nitride compound semiconductor laminated structure according to the above-described (1), wherein the buffer layer has a deposition temperature of room temperature to 800° C.
(11) The deposition method of a III group nitride compound semiconductor laminated structure according to the above-described (1), wherein the underlying layer has a deposition temperature of 300 to 1,500° C.
(12) The deposition method of a III group nitride compound semiconductor laminated structure according to the above-described (1), wherein a difference in the deposition temperature between the buffer layer and the underlying layer is 100° C. or higher.

According to the deposition method of a III group nitride compound semiconductor laminated structure of the present invention (Solution Means I), improvement of throughput and formation of a device having good characteristics can be performed by using a highly-uniform sputtering method, which is highly productive in mass production applications in order to form as thick an underlying layer as possible having good uniformity. According to the present invention, solution means I can provide a deposition technique of a III group nitride compound semiconductor laminated structure wherein a laminated buffer layer is deposited at a lower temperature than that used in a sputtering method and a layer containing Ga is formed by the same sputtering method.

The present invention provides the following inventions (13) to (20) (Solution Means II) so as to achieve the above object.
(13) A deposition method of a multilayered structure composed of a III group nitride compound semiconductor on a substrate, characterized in that: the multilayered structure comprises at least a buffer layer and an underlying layer from the substrate side, the buffer layer and the underlying layer are laminated by a sputtering method, and a thickness of the buffer layer is from 5 nm to 500 nm.
(14) The deposition method of a III group nitride compound semiconductor laminated structure according to the above-described (13), wherein the buffer layer contains Al.
(15) The deposition method of a III group nitride compound semiconductor laminated structure according to the above-described (14), wherein the buffer layer is formed of AlN.
(16) The deposition method of a III group nitride compound semiconductor laminated structure according to the above-described (14) or (15), wherein the buffer layer is formed of an aggregate of a columnar crystal.
(17) The deposition method of a III group nitride compound semiconductor laminated structure according to any one of the above-described (14) to (16), wherein at least 60% of the substrate surface is coated with the buffer layer.
(18) The deposition method of a III group nitride compound semiconductor laminated structure according to the above-described (13), wherein the underlying layer contains Ga.
(19) The deposition method of a III group nitride compound semiconductor laminated structure according to the above-described (18), wherein the underlying layer is formed of GaN.
(20) The deposition method of a III group nitride compound semiconductor laminated structure according to any one of the above-described (13) to (15), (18) and (19), wherein the buffer layer is formed of AlN and the underlying layer is formed of GaN.

According to the deposition method of a III group nitride compound semiconductor laminated structure of the present invention (Solution Means II), improvement of throughput and formation of a device having good characteristics can be performed by forming as thick an underlying layer as possible having good uniformity using a sputtering method having good throughput and uniformity. According to the present invention, solution means II can provide a deposition technique of a III group nitride compound semiconductor laminated structure wherein a buffer having a specific thickness is formed by a sputtering method and a layer containing Ga is formed thereon by the same sputtering method.

A second object of the present invention is to stably obtain a III group nitride compound semiconductor layer having good crystallinity using a sputtering method and a MOCVD method. The sputtering method is a technique capable of obtaining a crystal film having good uniformity in a short time when a III group nitride compound semiconductor layer is formed and the MOCVD method is capable of forming a film having good crystallinity with good controllability when a light-emissive layer and a contact layer are formed.

In order to achieve the above object, the present invention provides the following inventions (21) to (28)
(Solution Means III)
(21) A deposition method of a multilayered structure composed of a III group nitride compound semiconductor on a substrate, characterized in that: the multilayered structure comprises at least a buffer layer and an underlying layer from the substrate side, and the method comprising the steps of: forming at least a portion of the underlying layer by a sputtering method, and forming a light-emissive layer by an organic metal-organic chemical vapor deposition (MOCVD) method.
(22) A deposition method of a multilayered structure composed of a III group nitride compound semiconductor on a substrate, characterized in that: the multilayer structure comprises at least a buffer layer, an underlying layer, an n-contact layer, a light-emissive layer and a p-contact layer from the substrate side, the method comprising the steps of: forming a buffer layer and at least a portion of an underlying layer by a sputtering method, and forming a light-emissive layer and a p-contact layer by a MOCVD method.
(23) The deposition method of a III group nitride compound semiconductor laminated structure according to the above-described (22), wherein the n-contact layer is formed by a sputtering method.
(24) A deposition method of a multilayered structure composed of a III group nitride compound semiconductor on a substrate, characterized in that: the multilayer structure comprises at least a buffer layer, an underlying layer, an n-contact layer, a light-emissive layer and a p-contact layer from the substrate side, the method comprising the steps of: forming a buffer layer and at least a portion of a p-contact layer by a sputtering method, and forming a light-emissive layer by a MOCVD method.

(25) The deposition method of a III group nitride compound semiconductor laminated structure according to the above-described (24), wherein the n-contact layer is formed by a sputtering method.

(26) The deposition method of a III group nitride compound semiconductor laminated structure according to any one of the above-described (21) to (25), wherein a region on the underlying layer directly above at least the buffer layer is formed by a MOCVD method.

(27) A deposition apparatus of a multilayer structure composed of a III group nitride compound semiconductor, comprising a MOCVD chamber and a sputtering chamber.

(28) The deposition apparatus of a III group nitride compound semiconductor laminated structure according to the above-described (27), further comprising a wafer cleaning chamber.

In the III group nitride compound semiconductor laminated structure obtained by the present invention, since an underlying layer having a large thickness and required uniformity is formed using a sputtering method which has good throughput and uniformity. A light-emissive layer and contact layer, which have good crystallinity and controlled doping, are formed by a MOCVD method having excellent reaction control of the raw materials. Consequently a crystal film having good uniformity can be obtained within a short period of time and a device having improved throughput and good characteristics can be formed. The solution means III can provide a deposition technique of forming a III group nitride compound semiconductor laminated structure using a sputtering method and a MOCVD method in combination.

BEST MODE FOR CARRYING OUT THE INVENTION

[A] Re: Solution Means I

Figure 1:
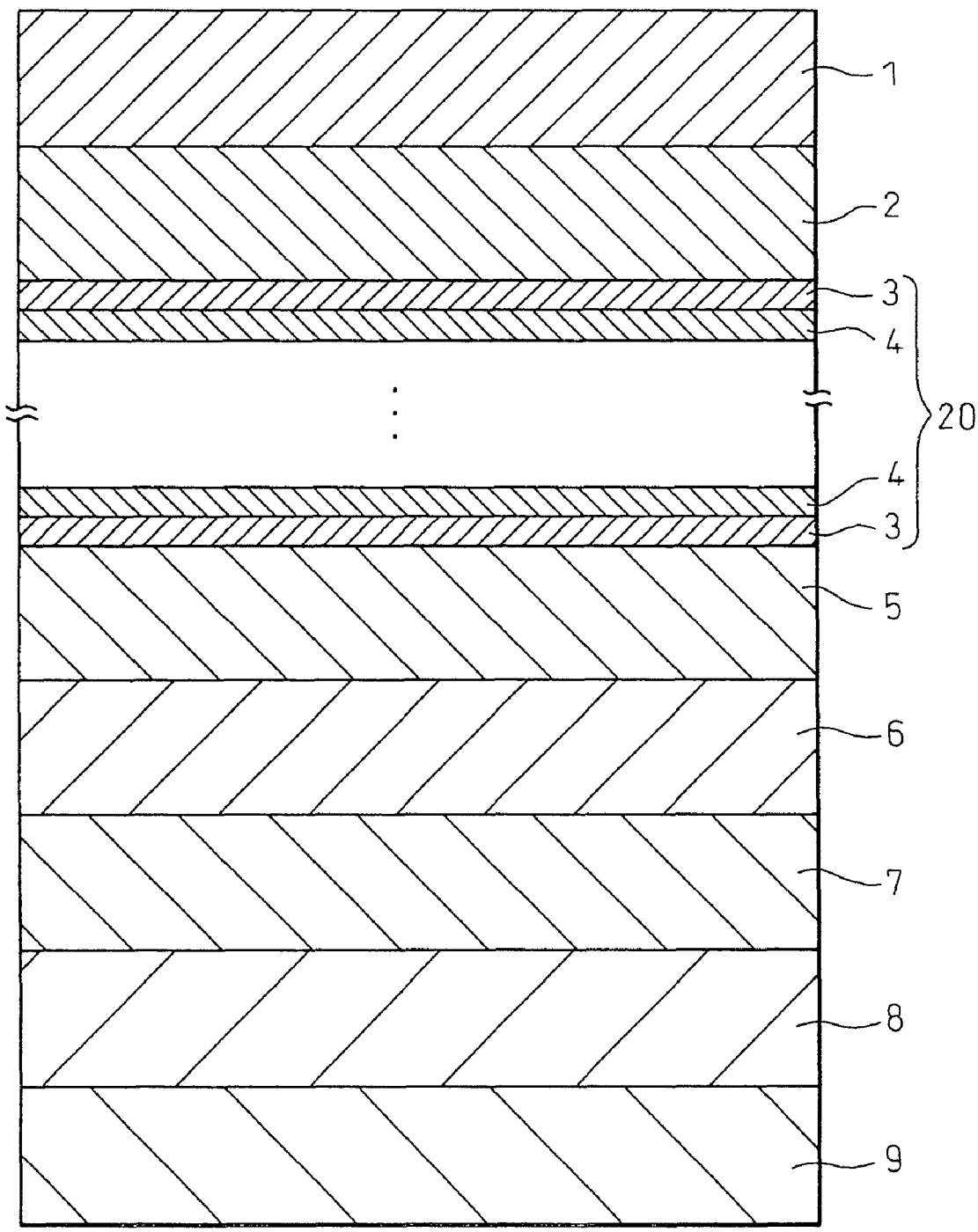
FIG. 1 is a schematic view showing a cross section of an epitaxial wafer having an epitaxial layer structure for a semiconductor light emitting device according to the Examples of the present invention.

The present invention discloses a technique wherein a buffer layer and an underlying layer are formed by a sputtering method during deposition of a III group nitride semiconductor laminated structure, and a deposition temperature of the buffer layer is adjusted to a temperature lower than a deposition temperature of the underlying layer.

Generally, a sputtering method is suited for deposition of a crystal with a single composition and displays excellent uniformity, throughput and stability characteristics. In addition there is less contamination such as dust in the chamber. Therefore, there has been a need for a technique of forming a GaN film having good crystallinity by sputtering. As a result of intensive research conducted by the present inventors, it has been found that it is important to adjust a deposition temperature of a buffer layer to a temperature lower than a deposition temperature of an underlying layer so as to obtain a III group nitride compound semiconductor crystal having good crystallinity by a sputtering method.

The substrate temperature of the buffer layer during deposition is preferably from room temperature to 1200°. When the substrate temperature is lower than the above range, migration on the substrate surface was suppressed and a III group nitride compound semiconductor crystal having good crystallinity cannot be easily obtained. In contrast, when the temperature is higher than the above range, the III group nitride compound semiconductor crystal is decomposed.

The substrate temperature is more preferably from room temperature to 800° C., and still more preferably from 300 to 800° C.

The deposition temperature of the underlying layer is preferably from 300° C. to 1,500° C., and more preferably from 500° C. to 1,000° C.

A difference in the deposition temperature between the buffer layer and the underlying layer is preferably from 100° C. to 800° C., and more preferably from 400° C. to 700° C.

(Sputtering Deposition Apparatus)

The sputtering method includes a RF sputtering method and a DC sputtering. Usually, when using reactive sputtering capable of reacting metal with nitrogen like the present invention, continuously discharging DC sputtering causes severe electrification and thus a deposition rate cannot be performed. Therefore, it is preferred to use pulse DC sputtering capable of giving a bias in a pulse manner during either RF sputtering and DC sputtering.

When RF sputtering is used, it is preferred to move a magnet in the target so as to enhance uniformity of the thickness. A specific moving method can be selected according to the apparatus and, for example, rocking or rotation can be performed.

When deposition of a III group nitride-based compound semiconductor crystal is performed by sputtering, it is preferred to supply reactive species having higher energy to a substrate during crystal growth. Therefore, it is adjusted so that the substrate is located in plasma in the apparatus. It is preferred that the target and the substrate face each other. A distance between the substrate and the target is preferably from 10 mm to 100 mm.

Since it is preferred that the level of residual impurities in the chamber be as low as possible, attainable pressure of the apparatus used in the deposition is preferably $1.0 \times 10^{-3}$ Pa or less.

(Material of Buffer Layer)

As the material constituting the buffer layer, any material can be used as long as it is a III group nitride compound semiconductor represented by the general formula: AlGaInN. Furthermore, the material may contain As or P as the V group. Among these materials, a material with the composition containing Al is preferred. Particularly, GaAlN is preferred. Al preferably accounts for 50%. It is more preferred that improved crystallinity can be obtained when the material is AlN.

The buffer layer is preferably formed of an aggregate of a columnar crystal descried hereinafter. A good columnar crystal is obtained by deposition at low temperature using a sputtering method, and it is easy to control the density, crystallinity or coating rate.

The columnar crystal in the present invention means a crystal in which adjacent crystal particles are separated by a crystal boundary formed between them and the crystal itself is a columnar longitudinal cross-sectional shape. When a buffer layer composed of a columnar crystal is formed on a substrate, a III group nitride compound semiconductor formed thereon is a crystal film having good crystallinity.

It is preferred that the entire substrate is completely coated with the buffer layer. When the substrate is no coated with the buffer layer and a portion of the surface of the substrate is exposed, since the III group nitride crystal layer formed on the buffer layer and the III group nitride crystal layer formed directly on the substrate differ in a lattice constant of the crystal. As a result, hillocks or pits occur.

Therefore, it is necessary that at least 60%, more preferably 80% or more, and most preferably 90% or more, of the surface of the substrate is coated with the buffer layer.

The percentage of the buffer layer, with which the substrate is coated, can be measured from a sectional transmission electron microscope (TEM) micrograph. Particularly, when the buffer layer and the III group nitride crystal layer differ in a material, a ratio of the region where the buffer layer is not formed can also be estimated by scanning the interface between the substrate and the layer in parallel to a substrate face using an electron beam energy dispersive spectrum (EDS). It is also possible to measure an exposed area of the substrate by preparing a sample with a buffer layer formed only using a technique such as an atomic force microscope (AFM). In the present invention, the exposed area was measured from the above sectional TEM micrograph.

In the buffer layer, it is preferred to properly control a width of a grain of each crystal of the columnar crystal. Specifically, the width of each columnar crystal is preferably within a range from 0.1 nm to 100 nm, and more preferably from 1 nm to 70 nm.

The width of each columnar crystal can be easily measured by the above sectional TEM micrograph. In other words, a distance of a boundary of each columnar crystal is a width of the columnar crystal. The width of each columnar crystal cannot be accurately defined and has some extent of distribution. Therefore, even when the proportion of each columnar crystal having a width, which is not within the above range, is several %, an adverse influence is not exerted on the effect of the present invention. It is preferred that 90% of more of the columnar crystal have the width within the above range.

(Deposition Conditions of Buffer Layer)

When the buffer layer is formed by sputtering, important parameters are a substrate temperature, a nitrogen partial pressure, a deposition rate, a bias and a power.

As a matter of course, it is necessary that the atmosphere in the chamber contains nitrogen. Nitrogen is decomposed and plasmanized to give a raw material for crystal growth. In order to efficiently perform sputtering of a target, a heavy gas with a low reactivity is often mixed, for example, argon or the like. A ratio of a nitrogen flow rate to a flow rate of nitrogen and argon is preferably from 20% to 98% in terms of a proportion of nitrogen. When the ratio is smaller than the above range, sputtering metal adheres in the form of metal. In contrast, when the ratio is larger than the above range, the amount of argon is small and a sputtering rate decreases. The ratio is particularly preferably from 25% to 90%.

The deposition rate is preferably adjusted to within a range from 0.001 nm/second to 0.5 nm/second. When the deposition rate is more than the above range, the film becomes amorphous without being converted into a crystal. In contrast, when the deposition rate is less than the above range, the length of the processing is not suitable for industrial application.

Since it is desired to enhance migration during crystal growth, the larger the bias applied to the substrate side and the power applied to the target, the better. For example, the bias applied to the substrate during deposition is adjusted to 1.5 W/cm$^2$ or more and the power applied to the target during deposition is adjusted within a range from 0.01 W/cm$^2$ to 5 Kw/cm$^2$.

(Material of Underlying Layer)

As a result of the test of the present inventors, the material of the underlying layer is preferably III group nitride containing Ga. Since it is necessary to form a dislocation loop so as to impart good crystallinity, a nitride containing Ga is a material which enables formation of dislocation loop. AlGaN is particularly preferred and GaN is also preferred.

The underlying layer may optionally have a structure doped with a dopant or an undoped structure. When a conductive substrate is used, it is preferred to form a structure comprising a chip and electrodes attached to both sides of the chip by doping the underlying layer thereby allowing an electric current to flow in a vertical direction in a layer structure. When an insulating substrate is used, since a chip structure comprising a chip and electrodes attached to the same sides of the chip is employed, the layer right above a substrate is preferably formed of an undoped crystal having good crystallinity.

The underlying layer is preferably flattened by growing using crystal nucleus generated on the buffer layer as seeds while forming a dislocation loop. In order to grow while forming a dislocation loop, it is necessary to bring the growth close to facet growth by activation of migration.

Therefore, the substrate temperature of the underlying layer during deposition is preferably higher than that in case of the buffer layer. A temperature higher than the deposition temperature of the buffer layer enables formation of a dislocation (interface of a columnar crystal) loop on the buffer layer. When the underlying layer is formed at a temperature lower than that of the buffer layer, a layer having crystallinity equivalent to the buffer layer is formed and thus a decrease in dislocation density cannot be attained.

(Deposition Conditions of Underlying Layer)

Parameters during deposition of the underlying layer will be described below.

As a matter of course, it is necessary that the atmosphere in the chamber contains nitrogen. Nitrogen is decomposed and plasmanized to give a raw material for crystal growth. In order to efficiently perform sputtering of a target, a heavy gas with low reactivity is often mixed, for example, argon or the like. A ratio of a nitrogen flow rate to a flow rate of nitrogen and argon is preferably from 20% to 100% in terms of a proportion of nitrogen. When the ratio is smaller than the above range, sputtering metal may adhere in the form of metal. The ratio is particularly preferably from 50% to 100%.

The deposition rate is preferably adjusted to within a range from 0.05 nm/second to 5 nm/second. When the deposition rate is more than the above range, the film becomes amorphous without being converted into a crystal. In contrast, when the deposition rate is less than the above range, the length of the processing is not suitable for industrial application.

Since it is desired to enhance migration during crystal growth, the larger the bias applied to the substrate side and the power applied to the target, the better. For example, the bias applied to the substrate during deposition is adjusted to 1.5 W or more and the power applied to the target during deposition is adjusted within a range from 0.01 W/cm$^2$ to 5 Kw/cm$^2$.

(Other Layers)

It is necessary that a layer having a device function can be further laminated on the underlying layer. For example, a contact layer, a clad layer and a light-emissive layer can be formed when producing a light-emissive layer. In the case of a laser device, an optical confinement layer can be formed, in addition to these layers. In the case of an electronic device, an electron transit layer and an electron confinement layer can be formed.

These layers can be formed using not only a sputtering method, but also a commonly known method. For example, a MOCVD method and a molecular beam epitaxy (MBE) method can be used.

(Substrate)

As the substrate which can be used in the present invention, any substrate can be used as long as it is a substrate capable of deposition of a III group nitride compound semiconductor crystal. Examples of the substrate include sapphire, SiC, silicon, zinc oxide, magnesium oxide, manganese oxide, zirconium hydroxide, zinc iron manganese oxide, magnesium aluminum oxide, zirconium boride, gallium oxide, indium oxide, lithium gallium oxide, lithium aluminum oxide, neodymium gallium oxide, lanthanum strontium oxide aluminum tantalum, strontium titanium oxide, titanium oxide, hafnium, tungsten and molybdenum. A sputtering method using no ammonia can be used as an effective deposition method for an oxide substrate or metal substrate which is contacted with ammonia at a high temperature to cause chemical modification.

Since the sputtering method can usually maintain the substrate temperature at a low temperature, it enables deposition on a substrate having a property of being decomposed at a high temperature without damaging the substrate.

The substrate is preferably subjected to a wet pretreatment. For example, when the surface of a silicon substrate is hydrogen-terminated using a well-known RCA cleaning method, a stable process is attained.

After introducing into a reactor, a pretreatment can be performed using a method such as reverse sputtering. Specifically, the surface can be adjusted by exposing to plasma of Ar or $N_2$. For example, by reacting the surface of the substrate with plasma of Ar or $N_2$, organic substances or oxides adhered on the surface can be removed. In this case, plasma particles are effectively reacted with the substrate by applying a voltage between the substrate and the chamber.

(Re: Applications)

The device produced in the method of the present invention can be used as a lamp after packaging. A technique of varying a luminescent color by using in combination with a phosphor material is known and this method can be used without any problems. For example, light having a long wavelength can be emitted from a light emitting device by properly selecting a fluorescent material. A white package can be obtained by mixing an emission wavelength of the light emitting device itself with a wavelength converted by a fluorescent material.

[B] Re: Solution Means II

In the present invention, a proper thickness of a buffer layer during deposition of a buffer layer and an underlying layer using a sputtering method is required during deposition of a III group nitride semiconductor laminated structure.

Generally, a sputtering method is suited for deposition of a crystal with a single composition and displays excellent uniformity, throughput and stability characteristics. In addition, there is less contamination such as dust in the chamber. Therefore, there has been a need for a technique of forming a GaN film having good crystallinity by sputtering. As a result of intensive research conducted by the present inventors, it has been found that it is important to adjust a deposition temperature of a buffer layer to a temperature lower than a deposition temperature of an underlying layer so as to obtain a III group nitride compound semiconductor crystal having good crystallinity by a sputtering method.

In the present invention, it is necessary that the thickness of the buffer layer is from 5 nm to 500 nm. When the thickness is less than the above range, strain caused by a difference in a lattice constant between the buffer layer and the substrate cannot be prevented. In contrast, when the thickness is more than the above range, unevenness occurs on the surface of the buffer layer and good buffer layer function is not obtained. The thickness is more preferably from 10 nm to 300 nm, and particularly preferably from 150 Å to 1,000 Å.

The substrate temperature of the buffer layer during deposition is preferably from room temperature to 1,200° C. When the substrate temperature is lower than the above range, migration on the substrate surface is suppressed and thus a III group nitride compound semiconductor crystal having good crystallinity cannot be easily obtained. In contrast, when the substrate temperature is higher than the above range, the II group nitride compound semiconductor crystal is decomposed.

The substrate temperature is more preferably from room temperature to 800° C., and still more preferably from 300 to 800° C.

The deposition temperature of the underlying layer is preferably from 300° C. to 1,500° C., and more preferably from 500° C. to 1,000° C.

The difference in the deposition temperature between the buffer layer and the underlying layer is preferably from 100° C. to 800° C., and more preferably from 400° C. to 700°.

With respect to the following items, the description in "[A] Re: Solution Means I" can be similarly applied: (Sputtering Deposition Apparatus), (Material of Buffer Layer), (Deposition Conditions of Buffer Layer), (Material of Underlying Layer), (Deposition Conditions of Underlying Layer), (Other Layers), (Substrate) and (Re: Applications).

[C] Re: Solution Means III

According to the present invention, in the deposition of a III group nitride compound semiconductor laminated structure, at least a portion of an underlying layer is formed by a sputtering method and a light-emissive layer is formed by a MOCVD method.

Generally, a sputtering method is suited for deposition of a crystal with a single composition and displays excellent uniformity, throughput and stability characteristics. In addition, there is less contamination such as dust in the chamber. Therefore, there has been a need for a technique of forming a GaN film having good crystallinity by sputtering. However, the sputtering method is not suited for deposition of a mixed crystal or doping and requires use of an apparatus.

A conventional MOCVD method displays excellent control of chemical reactions and therefore setting detailed conditions results in excellent and accurate control of the composition and doping. In addition, it also displays excellent deposition of a good crystal by epitaxial crystal growth. However, in addition to generation of dust in the chamber often results, also it is required to pay a close attention so as to maintain uniformity, throughput and stability.

Thus, in the present invention, at least a portion of a film of the underlying layer in the device, in which uniformity of the thickness is required and high throughput is required because of a large thickness, is formed by a sputtering method. A MOCVD method is used to form the light-emissive layer which requires control of the composition of a mixed crystal and good crystallinity, and the contact layer (especially a p-type contact layer), requiring control of a doping amount and good crystallinity. Therefore, the merits of both methods can be found and utilized and a device having good characteristics can be stably produced with good throughput.

A laminated structure required to produce a conventional III group nitride semiconductor light emitting device is shown in FIG. 1. This laminated structure includes a substrate, and layers such as a buffer layer, an underlying layer, an n-type contact layer, an n-type clad layer, a light-emissive layer, a p-type clad layer and a p-type contact layer.

From the above point of view, a layer to be preferably formed by a sputtering method includes a buffer layer and a portion of an underlying layer, while a layer to be preferably formed by a MOCVD method is an n-type clad layer, a light-emissive layer, a p-type clad layer, and a region right over a buffer layer of an underlying layer. Other n-type and p-type contact layers may be formed by any one of these methods. However, because of a difference in properties of an element serving as a dopant, when n-type contact layer is formed by a sputtering method and a p-type contact layer is formed by a MOCVD method, a drive voltage decreases and a device having good characteristics can be produced.

It is possible to select, as a deposition method of other layers having a function, from a sputtering method and a MOCVD method. Selection can be appropriately performed.

By forming a p-type layer by a sputtering method, a p-type semiconductor can be obtained without performing activation annealing which is used to activate a p-type dopant. Since radiant power output is damaged by breakage of a light-emissive layer caused by activation annealing, characteristics of the device can be satisfactorily maintained using a sputtering method to deposit a p-type layer.

Under these circumstances, there exists a merit due to sputtering deposition with respect to a p-clad layer and a p-contact layer.

(Substrate)

A substrate which can be used in the present invention includes any substrate as long as it is a substrate capable of deposition of a III group nitride compound semiconductor crystal. Examples of the substrate include sapphire, SiC, silicon, zinc oxide, magnesium oxide, manganese oxide, zirconium hydroxide, zinc iron manganese oxide, magnesium aluminum oxide, zirconium boride, gallium oxide, indium oxide, lithium gallium oxide, lithium aluminum oxide, neodymium gallium oxide, lanthanum strontium oxide aluminum tantalum, strontium titanium oxide, titanium oxide, hafnium, tungsten and molybdenum. When an underlying layer formed by a sputtering method serves as a coat layer, it prevents chemical deterioration on an oxide substrate or metal substrate, which are known to cause chemical modification when contacted with ammonia at a high temperature and a sputtering method can be used as an effective deposition method.

Since the sputtering method can usually maintain the substrate temperature at a low temperature, it enables deposition on a substrate having a property of being decomposed at a high temperature without damaging the substrate.

C-face or a-face sapphire substrate materials, which are often used for deposition of a III group nitride compound semiconductor crystal, are used most preferably.

The substrate is preferably subjected to a wet pretreatment. For example, when the surface of a silicon substrate is hydrogen-terminated using a well known RCA cleaning method, a stable process is attained.

After introducing into a reactor, a pretreatment can be performed using a method such as reverse sputtering. Specifically, the surface can be adjusted by exposing to a plasma of Ar or $N_2$. For example, by reacting the surface of the substrate with plasma of Ar or $N_2$, organic substances or oxides adhered on the surface can be removed. In this case, plasma particles are effectively reacted with the substrate by applying a voltage between the substrate and the chamber.

(Deposition of Buffer Layer)

The buffer layer is preferably formed using a sputtering method.

According to the present invention, a buffer layer is preferably formed of an aggregate of a columnar crystal. In order to obtain an aggregate of a columnar crystal, a proper columnar crystal can be formed by a deposition method such as a sputtering method in which a III group metal raw material and a gas containing a nitrogen element are activated with plasma, and such a deposition method is preferably employed.

The sputtering method includes a RF sputtering method and a DC sputtering. Usually, when using reactive sputtering capable of reacting metal with nitrogen like the present invention, continuously discharging DC sputtering causes severe electrification and thus a deposition rate cannot be performed. Therefore, it is preferred to use pulse DC sputtering capable of giving a bias in a pulse manner among RF sputtering and DC sputtering.

When RF sputtering is used, it is preferred to move a magnet within the target so as to avoid electrification. A specific moving method can be selected according to the apparatus and, for example, rocking or rotation can be performed.

When a buffer layer is formed by sputtering, it is preferred to supply reactive species having higher energy to a substrate. Therefore, it is adjusted so that the substrate is located in plasma in the apparatus. It is preferred that the target and the substrate face each other. A distance between the substrate and the target is preferably from 10 mm to 100 mm.

Since it is preferred that impurities are remained in the chamber as small as possible, the highest pressure of the apparatus used in the deposition is preferably $1.0 \times 10^{-3}$ Pa or less.

When deposition is performed by sputtering, important parameters are a substrate temperature, nitrogen partial pressure, deposition rate, bias and power.

As a matter of course, it is necessary that an atmosphere in a chamber contains nitrogen. Nitrogen is decomposed and plasmanized to give a raw material for crystal growth. In order to efficiently perform sputtering of a target, a heavy gas with low reactivity is often mixed, for example, argon or the like. A ratio of a nitrogen flow rate to a flow rate of nitrogen and argon is preferably from 20% to 98% in terms of a proportion of nitrogen. When the ratio is smaller than the above range, sputtering metal adheres in the form of metal. In contrast, when the ratio is larger than the above range, the amount of argon is small and a sputtering rate decreases. The ratio is particularly preferably from 25% to 90%.

The deposition rate is preferably adjusted to within a range from 0.01 nm/second to 10 nm/second. When the deposition rate is more than the above range, the film becomes amorphous without being converted into a crystal. In contrast, when the deposition rate is less than the above range, the length of the processing is not suitable for industrial application.

As a result of experiments conducted by the present inventors, it was found that the substrate temperature during deposition of the buffer layer is preferably from room temperature to 1,000° C. When the substrate temperature is lower than the above range, a III group nitride compound semiconductor crystal having crystallinity suited for use as a buffer layer could not be obtained. In contrast, when the substrate temperature is higher than the above range, the apparatus merely becomes complicated. The substrate temperature is more preferably from 200 to 900° C., and most preferable from 300 to 800° C.

Since it is desired to enhance migration during crystal growth, the larger the bias applied to the substrate side and the power applied to the target, the better. For example, the bias applied to the substrate during deposition is adjusted to 1.5 W/cm$^2$ or more and the power applied to the target during deposition is adjusted within a range from 1.5 W/cm$^2$ to 5 Kw/cm$^2$.

(Deposition Conditions of Underlying Layer)

At least a portion of an underlying layer is preferably formed by a sputtering method. However, a region right over a buffer layer is preferably formed using a MOCVD method.

When the underlying layer is formed by sputtering, it is desired to prevent propagation in a film thickness direction as possible by enhancing migration during crystal growth to form a dislocation loop. In order to prevent propagation, it is preferred to supply reaction species with higher energy. Therefore, it is adjusted so that the substrate is located in plasma in the apparatus. It is preferred that the target and the substrate face each other. A distance between the substrate and the target is preferably from 10 mm to 100 mm.

By the same reason, the substrate temperature during deposition is preferably from 300 to 1,500° C. When the substrate temperature is lower than the above range, migration on the substrate surface is suppressed and a III group nitride compound semiconductor crystal having good crystallinity cannot be easily obtained. In contrast, when the substrate temperature is higher than the above range, the III group nitride compound semiconductor crystal is decomposed. The substrate temperature is more preferably from 400 to 1300° C., and most preferably from 500 to 1,000° C.

When the underlying layer is formed on the buffer layer made of an aggregate of a column crystal formed by sputtering, crystallinity can be improved using a MOCVD method. The film formed by a sputtering method may be converted into a columnar crystal due to columnar properties of a base, namely, a crystal including threading dislocation. Therefore, through dislocation density can be decreased by facet growth while migrating at a high temperature using a MOCVD method.

As a result of the experiments conducted by the present inventors, the material of the underlying layer was preferably III group nitride containing Ga. It is necessary to form a dislocation loop by migration so as to impart good crystallinity, and the material capable of easily forming a dislocation loop is nitride containing Ga. AlGaN is particularly preferred and GaN is also preferred.

The underlying layer may optionally have a structure doped with a dopant or an undoped structure. When a conductive substrate is used, it is preferred to form a structure comprising a chip and electrodes attached to both sides of the chip by doping the underlying layer thereby allowing an electric current to flow in a vertical direction in a layer structure. When an insulating substrate is used, since a chip structure comprising a chip and electrodes attached to the same sides of the chip is employed, the layer right above a substrate is preferably formed of an undoped crystal having good crystallinity.

(Deposition Method of Light-Emissive Layer)

A MOCVD method is suited for deposition of a light-emissive layer to which accurate control of the composition is required. Similarly, the MOCVD method is also suited for deposition of an n-clad layer to which accurate control of crystallinity is required so as to control strain applied to the light-emissive layer.

The MOCVD method is a vapor deposition method in which an organic metal compound containing the objective III group element and a V group raw material are decomposed on a heated substrate thereby growing a crystal. The doping amount and the composition can be accurately controlled by adjusting the ratio of raw material gases contained in the gas to be circulated on the substrate or the substrate temperature. Excellent epitaxial growth is also obtained by selecting proper substrate and deposition conditions.

Before the MOCVD method is carried out, a wafer to be introduced is preferably cleaned. Cleaning includes a wet cleaning and cleaning using heating according to various purposes. The wet cleaning is performed for the purpose of removing particles adhered on the surface. The thermocleaning is performed for the purpose of removing surface oxides or organic substances by sublimation.

The wet cleaning is preferably scrub cleaning using pure water. In addition, an acid or an alkali can also be used.

The thermocleaning is effectively performed by a method of maintaining in a MOCVD furnace for subsequent growing at a temperature of 800° C. or higher at a given time. In that case, contaminants can be more effectively removed by circulating hydrogen or ammonia in a furnace.

It is most preferred that the wet cleaning and the thermocleaning can be simultaneously performed.

The growth conditions used in the MOCVD method may be conventional conditions. The substrate temperature during growing is preferably adjusted within a range from 500 to 1200° C. When the substrate temperature is higher than the above range, nitrogen is decomposed and good crystallinity cannot be maintained. In contrast, when the substrate temperature is lower than the above range, an organic metal raw material is not sufficiently decomposed and incorporation of carbon into a film may occur. When an In-containing layer is formed, since In is separated from the crystal under high temperatures, the temperature is preferably from about 500° C. to 900° C.

The pressure of a vapor phase atmosphere is preferably adjusted within a range from 50 mbar to 1,000 mbar. When the pressure is lower than the above range, the sufficient growth rate cannot be attained. In contrast, when the pressure is a normal pressure or higher, a chamber member deteriorates at a high temperature which results in the possibility of gas leakage.

In the case of growing a III group nitride semiconductor crystal, a ratio V/III is preferably adjusted within a range from 500 to 20,000.

The growth rate is preferably from about 1 Å/minute to 500 Å/minute. When the growth rate is less than the above range, throughput is poor. In contrast, when the growth rate is more than the above range, good crystallinity may not be realized.

As the nitrogen raw material used in the MOCVD method, ammonia ($NH_3$) is preferred since it is in the form of a gas that is easy to handle, commercially available and cheap.

The III group organic metal raw material used may include trimethyl aluminum (TMA), triethyl aluminum (TEA), tertiary butyl aluminum (TBA), trimethyl gallium (TMG), triethyl gallium (TEG), tertiary butyl gallium (TBG), trimethyl indium (TMI), triethyl indium (TEI), tertiary butyl indium (TBI) and cyclopentadienyl indium (CpIn).

(Re: p Layer)

With respect to a p layer to be formed on the outermost layer of the device structure, there is a merit in using a sputtering method and a MOCVD method, and the method can be selected from both methods.

First, when the sputtering method is used, a high temperature is not required during deposition of a p layer to be formed finally in the device structure. Thus, it is possible to avoid breakage of the light-emissive layer which may be damaged at high temperature.

When the p layer is formed using Mg as a dopant, activation of the dopant is inhibited by bonding of Mg and H and thus a heat treatment for activation may be required. The light-emissive layer can be broken by this heat treatment. Since a reaction atmosphere does not contain a large amount of hydrogen in sputtering deposition, a p layer having a high carrier concentration can be formed without using such a heat treatment.

Apparatus configurations and conditions for deposition can be analogous to those described in paragraphs of the underlying layer.

The method of doping with Mg as a dopant, for example, includes a method of dissolving in a Ga target, a method of embedding as a solid, a method of simultaneously sputtering using a target separately, and a method of supplying to a substrate using means other than sputtering, such as knudsen cell, ion beam, RF cracking, etc.

The MOCVD method is preferred since a film having good crystallinity can be laminated after doping with Mg. Since the MOCVD method displays particularly excellent facet growth, fine unevenness formed during deposition of the light-emissive layer can be filled. Thus, fine leak current can be suppressed and thus antistatic characteristics and aging deterioration resistance can be improved.

Since it is preferred to form a light-emissive layer by a MOCVD method, there is a merit that continuous deposition can be performed using the same apparatus.

Although activation by a heat treatment is required to form a Mg-doped p layer using a MOCVD method, it is also possible to omit heat treatment according to a composition of a vapor phase atmosphere gas during deposition or a composition of a gas at a high temperature.

Apparatus configurations and conditions in the case of deposition using a MOCVD method can be analogous to the above description in the active layer.

As the organic metal raw material to be doped with Mg, biscyclopentadienyl magnesium ($Cp_2Mg$) and bisdimethyl-cyclopentadienyl magnesium ($(MtCp)_2Mg$) can be used.

(Re: Apparatus)

The apparatus for forming a laminated structure in the process in the present invention is preferably an apparatus including both a sputtering chamber and a MOCVD chamber in the same apparatus.

With respect to transportation between chambers, contamination caused by oxygen in the air and stains caused by organic substances from the human body or clothes can be avoided by including a robot arm moving in a vacuum. It is possible to efficiently produce by transporting in the same apparatus.

This apparatus may include a pure water cleaner, a heat treatment chamber, a plasma treatment chamber and an ozone cleaning chamber.

(Re: Applications)

The device produced by this technique can be used as a lamp after packaging. A technique of varying a luminescent color by using in combination with a fluorescent material is known and this method can be used without causing any problem. For example, light having a long wavelength can be emitted from a light emitting device by properly selecting a fluorescent material. A white package can be obtained by mixing an emission wavelength of the light emitting device itself with a wavelength converted by a fluorescent material.

The present invention will be descried in detail by way of Examples. Examples 1, 2 and 3 to 5 correspond to solution means I, II and III, respectively. However, the present invention is not limited only to these Examples.

Example 1

In this Example, on a c-face sapphire substrate, an aggregate of a columnar crystal of AlN was formed as a buffer layer using an RF sputtering method and a layer of GaN was formed as a second layer thereon in an RF sputter in a different second layer.

First, a c-face sapphire substrate, one surface of which was mirror polished for use in epitaxial growth was introduced in a sputtering system without performing a wet pretreatment. The sputtering system to be used includes a high-frequency type power supply, and also includes a mechanism capable of moving the position where a magnetic field is applied by rotating a magnet in a target.

First, a substrate was heated to 750° C. in the sputtering system and, after introducing nitrogen gas at a flow rate of 15 sccm, 50 W high-frequency bias was applied to the substrate side while maintaining a pressure in the chamber at 0.08 Pa, and thus the substrate surface was cleaned by exposing to nitrogen plasma.

Subsequently, argon gas and nitrogen gas were introduced, and then the substrate temperature was decreased to 500° C. Power (0.95 $W/cm^2$) was applied to the metal Al target side and a layer of AlN was formed on the sapphire substrate under the conditions of circulation of an Ar gas at 15 sccm and an nitrogen gas at 5 sccm (proportion of nitrogen gas is 25% based on the entire gas) while maintaining a pressure in a furnace at 0.5 Pa. The growth rate was 0.12 nm/s.

The magnet in the target was rotated even during substrate cleaning and deposition.

After deposition of a 50 nm-thick layer of AlN, application of plasma was terminated and then the substrate was removed.

Subsequently, the substrate was transported in a different sputtering chamber. A sputtering system to be used for deposition of a layer of GaN includes a high-frequency type power supply, and also includes a mechanism capable of moving the position where magnetic field is applied by sweeping of a target in a rectangular Ga target. In the Ga target, piping for circulation of a refrigerant was disposed and refrigerant cooled to 20° C. was circulated in the piping thereby preventing melting of Ga by heat.

Subsequently, an argon gas and a nitrogen gas were introduced and the substrate temperature was raised to 1,000° C. 1.3 $W/cm^2$ of a power was applied to the metal Ga target side and a layer of GaN was formed on the sapphire substrate under the conditions of circulation of an Ar gas at 5 sccm and a nitrogen gas at 15 sccm (proportion of nitrogen based on the entire gas: 75%) while maintaining a pressure in the furnace at 0.5 Pa. The growth rate was about 1 nm/s. After deposition of a 6 μm thick layer of GaN, supply of plasma was terminated.

Subsequently, under the same conditions, 2 μm thick Si-doped GaN layer having an electron concentration of $1\times10^{19}$ $cm^{-3}$ was formed.

Under the same conditions as an undoped layer, a Si target disposed in the chamber was irradiated with ions emitted from an ion gun thereby extracting Si, followed by doping with Si.

According to the above steps, a III group nitride compound semiconductor laminated structure of the present invention, comprising a sapphire substrate, a first layer of AlN having a columnar structure formed on the sapphire substrate and 6 μm thick GaN layer and a 2 μm thick Si-doped GaN layer having an electron concentration of $1\times10^{19}$ cm$^{-3}$ formed thereon was produced. The substrate taken out from the sputtering system showed a colorless transparent mirror finished surface.

Next, an X-ray rocking curve (XRC) of an undoped GaN layer grown by the above method was measured. Using a Cuβ-ray X-ray source as a light source, the measurement was performed at a (0002) plane as a symmetric plane and a (10-10) plane as an asymmetric plane. Usually, in the case of a III group nitride compound semiconductor, an XRC spectrum half band width of the (0002) plane serves as an indicator of smoothness (mozaicity) of a crystal, while a XRC spectrum half band width of the 10-10) plane serves as an indicator of dislocation density (twist). As a result of the measurement, the undoped GaN layer formed by the method of the present invention showed a half band width of 80 arcsec in the measurement of the (0002) plane and showed a half band width of 250 arcsec in the (10-10) plane.

On the Si-doped GaN layer formed by the above procedure, a device structure was formed by a MOCVD method and, finally, an epitaxial wafer having a layer structure for a semiconductor light emitting device shown in FIG. 1 was produced. Namely, the epitaxial wafer has a structure obtained by forming on a sapphire substrate 9 having a c-face, an AlN layer 8 having a columnar structure (buffer layer), and sequentially laminating, from the substrate side, a 6 μm thick undoped GaN layer 7 (underlying layer), a 2 μm thick Si-doped GaN layer 6 having an electron concentration of $1\times10^{19}$ cm$^{-3}$, a 20 nm thick $In_{0.1}Ga_{0.9}N$ clad layer 5 having an electron concentration of $1\times10^{18}$ cm$^{-3}$, a multiple quantum well structure 20 comprising 6-layered GaN barrier layer 3 having a thickness of 16 nm and 5 layered undoped $In_{0.2}Ga_{0.8}N$ well layer 4 having a thickness of 3 nm, the multiple quantum well structure comprising the GaN barrier layer as a first layer and the GaN barrier layer as the final layer, an $Al_{0.1}Ga_{0.9}N$ clad layer 2 doped with 5 nm of Mg and a 200 nm thick Mg-doped $Al_{0.02}Ga_{0.98}N$ layer 1.

Figure 2:
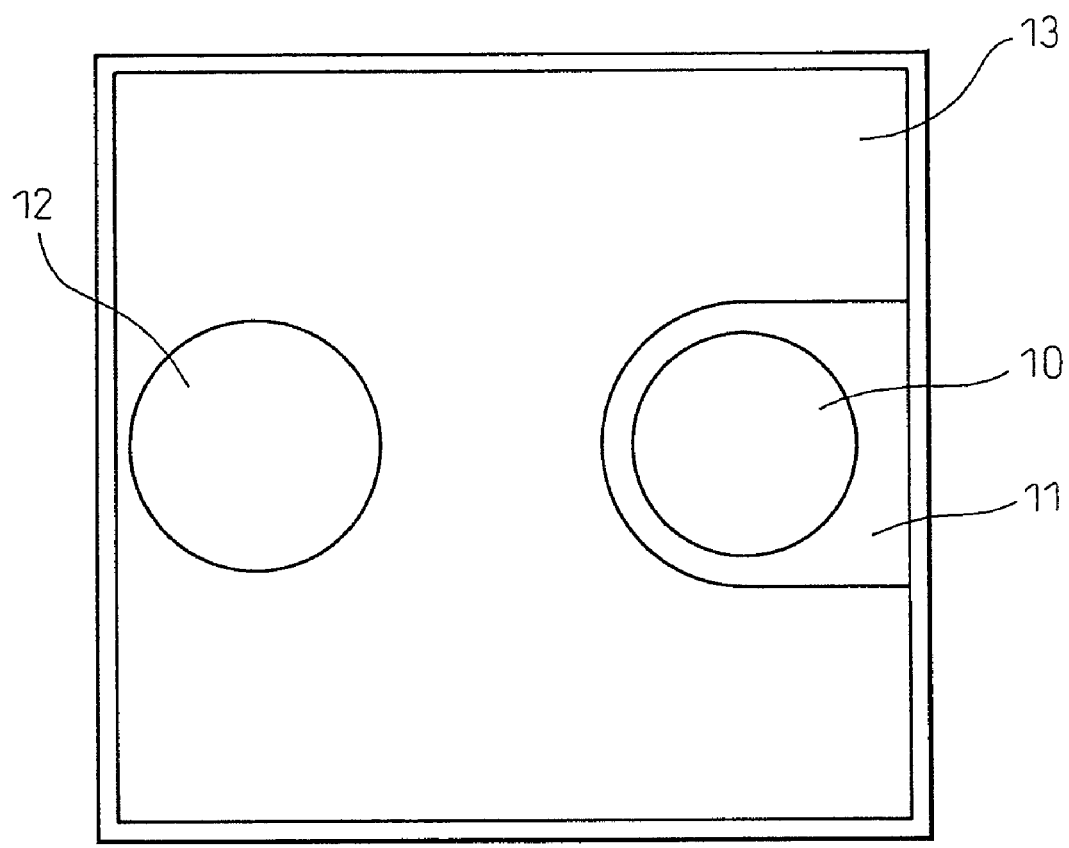
FIG. 2 is a plan view showing an electrode structure of a semiconductor light emitting device according to the Examples of the present invention.

A plan view of an electrode structure of the semiconductor light emitting device produced in this example is shown in FIG. 2. In the figure, 10 denotes an n-side electrode, 11 demotes an exposed face of a Si-doped GaN layer 6 for formation of an electrode, 12 denotes a p electrode bonding pad, and 13 denotes a translucent p electrode.

The Si-doped GaN wafer produced by sputtering was cleaned with pure water before placing in a MOCVD chamber and then dried for the purpose of removing residual surface particles.

First, the substrate having a grown Si-doped GaN layer formed thereon was introduced into a MOCVD furnace.

Then, the temperature of the substrate temperature was raised to 1,000° C. under conditions where the atmosphere in the furnace was replaced by nitrogen, and stains adhered on the outermost surface of the Si—GaN layer were removed by sublimation. At a substrate temperature of 830° C. or higher, ammonia was circulated in the furnace.

After the substrate temperature was decreased to 740° C., while circulating ammonia as it is, a silane ($SiH_4$) gas, and vapor of trimethyl indium (TMT) and triethyl gallium (TEG) generated by bubbling were circulated in the furnace to form a 20 nm thick Si-doped $In_{0.1}Ga_{0.9}N$ clad layer 5. After switching valves of TMT, TEG and $SiH_4$, supply of these raw materials was terminated.

Subsequently, a multiple quantum well structure 20 comprising a barrier layer 3 made of GaN and a well layer 4 made of $In_{0.2}G_{0.8}N$ was produced. The multiple quantum well structure was produced by forming a GaN barrier layer 3 on a Si-doped $In_{0.1}Ga_{0.9}N$ clad layer 5, and then forming an $In_{0.2}Ga_{0.8}N$ well layer 4 on the GaN barrier layer. After repeatedly laminating this structure five times, a sixth GaN barrier layer was formed on the fifth $In_{0.2}Ga_{0.8}N$ well layer and then both sides of the multiple quantum well structure 20 were composed of the GaN barrier layer 3.

After the completion of the growth of the Si-doped $In_{0.1}Ga_{0.9}N$ clad layer 5, TEG was supplied into the furnace by switching a valve of TEG while maintaining the substrate temperature, the pressure in the furnace, and the flow rate and kind of a carrier gas, thereby growing a GaN barrier layer. As a result, a 16 nm thick GaN barrier layer 3 was formed.

After the completion of the growth of the GaN barrier layer, TEG and TMI were supplied in the furnace by switching valves of TEG and TMI. An $In_{0.2}Ga_{0.8}N$ well layer was produced while maintaining the substrate temperature, the pressure in the furnace, the flow rate and kind of a carrier gas. As a result, a 3 nm thick $In_{0.2}Ga_{0.8}N$ well layer 4 was formed.

After the completion of the growth of the $In_{0.2}Ga_{0.8}N$ well layer, the GaN barrier layer was grown again. Such a procedure was repeated five times to form a 5-layered GaN barrier layer and a 5-layered $In_{0.2}Ga_{0.8}N$ well layer. Furthermore, a GaN barrier layer was formed on the final $In_{0.2}Ga_{0.8}N$ well layer.

The final layer of the multiple quantum well structure 20 is a GaN barrier layer, a Mg-doped $In_{0.1}Ga_{0.9}N$ clad layer 2 was formed using a MOCVD method.

First, the pressure in the furnace was adjusted to 200 mbar, the substrate temperature was adjusted to 1,020° C. and the carrier gas was changed to hydrogen from nitrogen and, after stabilization of the pressure and temperature in the furnace, supply of raw materials into the furnace was initiated by switching valves of TEG, TMA and biscyclopentadienyl magnesium ($Cp_2Mg$). A Mg-doped $Al_{0.1}Ga_{0.9}N$ clad layer was grown to form a 5 nm thick Mg-doped $Al_{0.1}Ga_{0.9}N$ clad layer 2.

An Mg-doped $Al_{0.02}Ga_{0.98}N$ layer 1 was formed on the Mg-doped $Al_{0.1}Ga_{0.9}N$ clad layer.

While maintaining the temperature, pressure and carrier gas at the same conditions as in case of the growth of the clad layer, supply of TMA, TMG and $Cp_2Mg$ into the furnace was initiated and the growth was performed. The flow rate of $Cp_2Mg$ was examined in advance and a hole concentration of a Mg-doped $Al_{0.02}Ga_{0.98}N$ contact layer was adjusted to $8\times10^{17}$ cm$^{-3}$ to form a 200 nm thick Mg-doped $Al_{0.02}Ga_{0.98}N$ layer 1.

After the completion of the growth of the Mg-doped $Al_{0.02}Ga_{0.98}N$ layer, heating was terminated and the temperature of the substrate was decreased to room temperature over 20 minutes. Immediately before the completion of growth, the flow rate of $NH_3$ was decreased to 1/50 and the carrier was changed to nitrogen from hydrogen. Then, supply of $NH_3$ was completely terminated at 950° C.

After confirming that the substrate temperature had fallen to room temperature, the wafer was taken out in the atmospheric air.

By the above procedure, an epitaxial wafer having a layer structure for a semiconductor light emitting device was produced. Herein, a Mg-doped $Al0_{.02}Ga_{0.98}N$ layer 1 was a p-type without performing an annealing treatment for activating a p-type carrier.

Using an epitaxial wafer in which an epitaxial layer structure is laminated on the above sapphire substrate, a light emitting diode as a kind of a semiconductor light emitting device was produced. A p electrode bonding pad 12 and a transparent p electrode 13 made of ITO were formed on the surface of a Mg-doped $Al_{0.02}Ga_{0.98}N$ layer on the obtained wafer. The p electrode bonding pad 12 was laminated sequentially of titanium, aluminum and gold. The layers were formed thereon using a known photolithographic technique to thus obtain a p-side electrode. Furthermore, the wafer was dry-etched thereby exposing a portion 11 constituting an n-side electrode of the Si-doped GaN layer, and then an n-side electrode 10 comprising four layers made of Ni, Al, Ti and Au was produced on the exposed portion. By these operations, an electrode having a shape shown in FIG. 2 was produced on the wafer.

With respect to the wafer on which p-side and n-side electrodes are formed, the back surface of the sapphire substrate was ground and polished to obtain a mirror finished surface. The wafer was cut into square chips of 350 µm sides, placed on a lead frame so that the electrode faces upward, followed by connection to the lead frame using a gold wire to obtain a light emitting device. A forward electric current was applied between p-side and n-side electrodes of the light emitting diode thus obtained. As a result, a forward voltage at an electric current of 20 mA was 3.0 V. Light emission was observed through the p-side translucent electrode. As a result, the emission wavelength was 470 nm and the radiant power output was 15 mW. Characteristics of the light emitting diode were free from variation with respect to the light emitting diode produced from nearly the entire wafer.

Example 2

In this Example, on a c-face sapphire substrate, an aggregate of a columnar crystal of AlN was formed as a buffer layer using an RF sputtering method and a layer of GaN was formed as a second layer thereon in an RF sputter in a different second layer.

First, a c-face sapphire substrate in which only one surface was mirror polished for use in epitaxial growth was introduced in a sputtering system without performing a wet pretreatment. The sputtering system to be used includes a high-frequency type power supply, and also includes a mechanism capable of moving the position where a magnetic field is applied by rotating a magnet in a target.

First, a substrate was heated to 750° C. in the sputtering system and, after introducing a nitrogen gas at a flow rate of 15 sccm, a 50 W high-frequency bias was applied to the substrate side while maintaining a pressure in the chamber at 0.08 Pa, and thus the substrate surface was cleaned by exposing to nitrogen plasma.

Subsequently, argon and nitrogen gas were introduced, and the substrate temperature was decreased to 500° C. Power (0.95 W/cm$^2$) was applied to the metal Al target side and a layer of AlN was formed on the sapphire substrate under the conditions of circulation of Ar gas at 15 sccm and nitrogen gas at 5 sccm (proportion of nitrogen gas is 25% based on the entire gas) while maintaining a pressure in a furnace at 0.5 Pa. The growth rate was 0.12 nm/s.

The magnet in the target was rotated during substrate cleaning and deposition.

After deposition of a 50 nm-thick layer of AlN, application of plasma was terminated and then the substrate was removed.

Subsequently, the substrate was transported in a different sputtering chamber. A sputtering system used for deposition of a GaN layer includes a high-frequency type power supply, and also includes a mechanism capable of moving the position where magnetic field is applied by sweeping of a target in a rectangular Ga target. In the Ga target, piping for circulation of a refrigerant was disposed and refrigerant cooled to 20° C. was circulated in the piping thereby preventing fusion (melting??) of Ga by heat.

Subsequently, an argon gas and a nitrogen gas were introduced and the substrate temperature was raised to 1,000° C. 1.3 W/cm$^2$ of a power was applied to the metal Ga target side and a layer of GaN was formed on the sapphire substrate under the conditions of circulation of an Ar gas at 5 sccm and a nitrogen gas at 15 sccm (proportion of nitrogen based on the entire gas: 75%) while maintaining a pressure in the furnace at 0.5 Pa. The growth rate was about 1 nm/s. After deposition of a 6 µm thick layer of GaN, supply of plasma was terminated.

Subsequently, under the same conditions, 2 µm thick Si-doped GaN layer having an electron concentration of $1\times10^{19}$ cm$^{-3}$ was formed.

Under the same conditions as in the case of an undoped layer, a Si target disposed in the chamber was irradiated with ions emitted from an ion gun thereby extracting Si, followed by doping with Si.

According to the above steps, a III group nitride compound semiconductor laminated structure of the present invention, comprising a sapphire substrate, a first layer of AlN having a columnar structure formed on the sapphire substrate and 6 µm thick GaN layer and a 2 µm thick Si-doped GaN layer having an electron concentration of $1\times10^{19}$ cm$^{-3}$ formed thereon was produced. The removed substrate showed a colorless transparent mirror finished surface.

Next, an X-ray rocking curve (XRC) of an undoped GaN layer grown by the above method was measured. Using a Cuβ-ray X-ray source as a light source, the measurement was performed at a (0002) plane as a symmetric plane and a (10-10) plane as an asymmetric plane. Usually, in the case of a III group nitride compound semiconductor, an XRC spectrum half band width of the (0002) plane serves as an indicator of smoothness (mozaicity) of a crystal, while a XRC spectrum half band width of the 10-10) plane serves as an indicator of dislocation density (twist). As a result of the measurement, the undoped GaN layer formed by the method of the present invention showed a half band width of 80 arcsec in the measurement of the (0002) plane and showed a half band width of 250 arcsec in the (10-10) plane.

On the Si-doped GaN layer formed by the above procedure, a device structure was formed by a MOCVD method and, finally, an epitaxial wafer having a layer structure for a semiconductor light emitting device shown in FIG. 1 was produced. Namely, the epitaxial wafer has a structure obtained by forming on a sapphire substrate 9 having a c-face, an AlN layer 8 having a columnar structure (buffer layer), and sequentially laminating, from the substrate side, a 6 µm thick undoped GaN layer 7 (underlying layer), a 2 µm thick Si-doped GaN layer 6 having an electron concentration of $1\times10^{19}$ cm$^{-3}$, a 20 nm thick In$_{0.1}$Ga$_{0.9}$N clad layer 5 having an electron concentration of $1\times10^{18}$ cm$^{-3}$, a multiple quantum well structure 20 comprising 6-layered GaN barrier layer 3 having a thickness of 16 nm and 5 layered undoped In$_{0.2}$Ga$_{0.8}$N well layer 4 having a thickness of 3 nm, the multiple quantum well structure comprising the GaN barrier layer as a first layer and the GaN barrier layer as the final layer, an Al$_{0.1}$Ga$_{0.9}$N clad layer 2 doped with 5 nm of Mg and a 200 nm thick Mg-doped Al$_{0.02}$Ga$_{0.98}$N layer 1.

A plan view of an electrode structure of the semiconductor light emitting device produced in this example is shown in FIG. 2. In the figure, 10 denotes an n-side electrode, 11 demotes an exposed face of a Si-doped GaN layer 6 for formation of an electrode, 12 denotes a p electrode bonding pad, and 13 denotes a translucent p electrode.

The Si-doped GaN wafer produced by sputtering was cleaned with pure water before placing in a MOCVD chamber and then dried for the purpose of removing residual surface particles.

First, the substrate having a grown Si-doped GaN layer 5 formed thereon was introduced into a MOCVD furnace.

Then, the temperature of the substrate temperature was raised to 1,000° C. in a state under conditions where the atmosphere in the furnace was replaced by nitrogen, and stains adhered on the outermost surface of the Si—GaN layer 10 were removed by sublimation. At the substrate temperature of 830° C. or higher, ammonia was circulated in the furnace.

After the substrate temperature was decreased to 740° C., while circulating ammonia, a silane ($SiH_4$) gas, and steam of trimethyl indium (TMI) and triethyl gallium (TEG) generated by bubbling were circulated in the furnace to form a 20 nm thick Si-doped $In_{0.1}Ga_{0.9}N$ clad layer 5. After switching valves of TMI, TEG and $SiH_4$, supply of these raw materials was terminated.

Subsequently, a multiple quantum well structure 20 comprising a barrier layer 3 made of GaN and a well layer 4 made of $In_{0.1}G_{0.8}N$ was produced. The production of the multiple quantum well structure was performed by forming a GaN barrier layer 3 on a Si-doped $In_{0.1}Ga_{0.9}N$ clad layer 5, and then forming an $In_{0.2}Ga_{0.8}N$ well layer 4 on the GaN barrier layer. After repeatedly laminated this structure five times, a sixth GaN barrier layer was formed on the fifth $In_{0.2}Ga_{0.8}N$ well layer and then both sides of the multiple quantum well structure 20 were composed of the GaN barrier layer 3.

After the completion of the growth of the Si-doped $In_{0.1}Ga_{0.9}N$ clad layer 5, TEG was supplied into the furnace by switching a valve of TEG while maintaining the substrate temperature, the pressure in the furnace, and the flow rate and kind of a carrier gas. In this manner a GaN barrier layer was grown and as a result, a 16 nm thick GaN barrier layer 3 was formed.

After the completion of the growth of the GaN barrier layer, TEG and TMI were supplied in the furnace by switching valves of TEG and TMI while maintaining the substrate temperature, the pressure in the furnace, and the flow rate and kind of a carrier gas, thereby growing an $In_{0.2}Ga_{0.8}N$ well layer. As a result, a 3 nm thick $In_{0.2}Ga_{0.8}N$ well layer 4 was formed.

After the completion of the growth of the $In_{0.2}Ga_{0.8}N$ well layer, the GaN barrier layer was grown again. Such a procedure was repeated five times to form a 5-layered GaN barrier layer and a 5-layered $In_{0.2}Ga_{0.8}N$ well layer. Furthermore, a GaN barrier layer was formed on the final $In_{0.2}Ga_{0.8}N$ well layer.

On the multiple quantum well structure 20 comprising the GaN barrier layer as the final layer, a Mg-doped $In_{0.1}Ga_{0.9}N$ clad layer 2 was formed using a MOCVD method.

First, the pressure in the furnace was adjusted to 200 mbar, the substrate temperature was adjusted to 1,020° C. and the carrier gas was changed to hydrogen from nitrogen and, after stabilization of the pressure and temperature in the furnace, supply of raw materials into the furnace was initiated by switching valves of TEG, TMA and biscyclopentadienyl magnesium ($Cp_2Mg$). A Mg-doped $Al_{0.1}Ga_{0.9}N$ clad layer was grown to form a 5 nm thick Mg-doped $Al_{0.1}Ga_{0.9}N$ clad layer 2.

A Mg-doped $Al_{0.02}Ga_{0.98}N$ layer 1 was formed on the Mg-doped $Al_{0.1}Ga_{0.9}N$ clad layer.

While maintaining the temperature, pressure and carrier gas at the same conditions as in case of the growth of the clad layer, supply of TMA, TMG and $Cp_2Mg$ into the furnace was initiated and the growth was performed. The flow rate of $Cp_2Mg$ was studied in advance and a hole concentration of a Mg-doped $Al_{0.02}Ga_{0.98}N$ contact layer was adjusted to $8×10^{17}$ cm$^{-3}$ to form a 200 nm thick Mg-doped $Al_{0.02}Ga_{0.98}N$ layer 1.

After the completion of the growth of the Mg-doped $Al_{0.02}Ga_{0.98}N$ layer, heating was terminated and the temperature of the substrate was decreased to room temperature over 20 minutes. Immediately before the completion of the growth, the flow rate of $NH_3$ was decreased to ⅟50 and the carrier was changed to nitrogen from hydrogen. Then, supply of $NH_3$ was completely terminated at 950° C.

After confirming that the substrate temperature was decreased to room temperature, the wafer was taken out in the atmospheric air.

By the above procedure, an epitaxial wafer having a layer structure for a semiconductor light emitting device was produced. Herein, a Mg-doped $Al_{0.02}Ga_{0.98}N$ layer 1 was a p-type without performing an annealing treatment for activating a p-type carrier.

Using an epitaxial wafer in which an epitaxial layer structure is laminated on the above sapphire substrate, a light emitting diode as a kind of a semiconductor light emitting device was produced. A p electrode bonding pad 12 and a transparent p electrode 13 made of ITO were formed on the surface of a Mg-doped $Al_{0.02}Ga_{0.98}N$ layer on the obtained wafer. The p electrode bonding pad 12 was laminated sequentially of titanium, aluminum and gold. The layers were formed thereon using a known photolithographic technique to thus obtain a p-side electrode. Furthermore, the wafer was dry-etched thereby exposing a portion 11 constituting an n-side electrode of the Si-doped GaN layer, and then an n-side electrode 10 comprising four layers made of Ni, Al, Ti and Au was produced. By these operations, an electrode having a shape shown in FIG. 2 was produced on the wafer.

With respect to the wafer on which p-side and n-side electrodes are formed, the back surface of the sapphire substrate was ground and polished to obtain a mirror finished surface. The wafer was cut into square chips of 350 μm square, placed on a lead frame so that the electrode faces up, followed by connection to the lead frame using a gold wire to obtain a light emitting device. A forward electric current was applied between p-side and n-side electrodes of the light emitting diode thus obtained. As a result, a forward voltage at an electric current of 20 mA was 3.0 V. Light emission was observed through the p-side translucent electrode. As a result, the emission wavelength was 470 nm and the radiant power output was 15 mW. The characteristics of the light emitting diode were free from variation with respect to the light emitting diode produced from nearly the entire wafer.

Example 3

In this example, a buffer layer, an underlying layer and an n-contact layer were formed by a sputtering process, and an n-clad layer, a light-emissive layer, a p-clad layer and a p-contact layer were formed by a MOCVD process. An apparatus used for deposition two sputtering chambers and one MOCVD chamber, and these chambers are connected with a vacuum core. In the core, a robot arm is disposed and a wafer is transported in a state of a wafer tray.

First, using a first sputtering chamber, a c-face sapphire substrate was subjected to a plasma treatment and an aggregate of a columnar crystal of AlN was formed thereon as a buffer layer using an RP sputtering method, and then a layer of GaN was formed thereon as an underlying layer and an n-contact layer in a second sputtering chamber using an RF sputter. The n-contact layer was doped with Si. The procedure will be described in detail below.

A c-face sapphire substrate in which only one surface was mirror polishing for use in epitaxial growth was introduced in a sputtering system without performing a wet pretreatment. The sputtering system to be used includes a high-frequency type power supply, and also includes a mechanism capable of moving the position where a magnetic field is applied by rotating a magnet in a target.

First, a substrate was heated to 750° C. in the sputtering system and, after introducing a nitrogen gas at a flow rate of 15 sccm, a 50 W high-frequency bias was applied to the substrate side while maintaining a pressure in the chamber at 0.08 Pa, and thus the substrate surface was cleaned by exposing to nitrogen plasma.

Subsequently, argon and nitrogen gas were introduced, and then the substrate temperature was decreased to 500° C. high-frequency bias of 2,000 W was applied to the metal Al target side and a layer of AlN was formed on the sapphire substrate under the conditions of circulation of Ar gas at 15 sccm and nitrogen gas at 5 sccm (proportion of nitrogen gas is 25% based on the entire gas) while maintaining a pressure in a furnace at 0.5 Pa. The growth rate was 0.12 nm/s.

The magnet in the target was rotated even in case of cleaning of the substrate and deposition. After forming a 50 nm thick layer of AlN, supply of plasma was terminated. Subsequently, the substrate was transported in a second sputtering chamber.

A sputtering system to be used for deposition of a layer of GaN includes a high-frequency type power supply, and also includes a mechanism capable of moving the position where magnetic field is applied by sweeping of a target in a rectangular Ga target. In the Ga target, piping for circulation of a refrigerant was disposed and refrigerant cooled to 20° C. was circulated in the piping thereby preventing fusion (melting??) of Ga by heat.

Subsequently, argon and nitrogen gas were introduced and the substrate temperature was raised to 1,000° C. high-frequency bias of 2,000 W was applied to the metal Al target side and a layer of GaN was formed on the sapphire substrate under the conditions of circulation of Ar gas at 5 sccm and nitrogen gas at 15 sccm (proportion of nitrogen based on the entire gas: 75%) while maintaining a pressure in the furnace at 0.5 Pa. The growth rate was about 1 nm/s. After deposition of a 6 μm thick layer of GaN, supply of plasma was terminated.

Subsequently, under the same conditions, 2 μm thick Si-doped GaN layer having an electron concentration of $1 \times 10^{19}$ cm$^{-3}$ was formed.

Under the same conditions as in an undoped layer, a Si target disposed in the chamber was irradiated with ions emitted from an ion gun thereby extracting Si, followed by doping with Si.

Under the same conditions as in an undoped layer, a power was introduced into a Si target disposed in the chamber and Si was taken out in a vapor phase by simultaneously sputtering, followed by doping of Si in the GaN crystal.

According to the above steps, a III group nitride compound semiconductor laminated structure of the present invention, comprising a buffer layer having a columnar structure formed on the sapphire substrate and 6 μm thick GaN layer and a 2 μm thick Si-doped GaN layer having an electron concentration of $1 \times 10^{19}$ cm$^{-3}$ formed thereon was produced. The removed substrate showed a colorless transparent mirror finished surface.

Next, an X-ray rocking curve (XRC) of an undoped GaN layer grown by the above method was measured. Using a Cuβ-ray X-ray source as a light source, the measurement was performed at a (0002) plane as a symmetric plane and a (10-10) plane as an asymmetric plane. Usually, in the case of a III group nitride compound semiconductor, an XRC spectrum half band width of the (0002) plane serves as an indicator of smoothness (mozaicity) of a crystal, while a XRC spectrum half band width of the 10-10) plane serves as an indicator of dislocation density (twist).

As a result of the measurement, the undoped GaN layer formed by the method of the present invention showed a half band width of 80 arcsec in the measurement of the (0002) plane and showed a half band width of 250 arcsec in the (10-10) plane.

On the Si-doped GaN layer formed by the above procedure, a device structure comprising an n-clad layer, a light-emissive layer, a p clad layer and a p contact layer was formed by transporting to a MOCVD chamber without taking out during the operation and, finally, an epitaxial wafer having a layer structure for a semiconductor light emitting device shown in FIG. 1 was produced.

Namely, the epitaxial wafer has a structure obtained by forming on a sapphire substrate 9 having a c-face, an AlN layer 8 having a columnar structure (buffer layer), and sequentially laminating, from the substrate side, a 6 μm thick undoped GaN layer 7 (underlying layer), a 2 μm thick Si-doped GaN layer 6 having an electron concentration of $1 \times 10^{19}$ cm$^{-3}$, a 20 nm thick In$_{0.1}$Ga$_{0.9}$N clad layer 5 having an electron concentration of $1 \times 10^{18}$ cm$^{-3}$, a multiple quantum well structure 20 comprising 6-layered GaN barrier layer 3 having a thickness of 16 nm and 5 layered undoped In$_{0.2}$Ga$_{0.8}$N well layer 4 having a thickness of 3 nm, the multiple quantum well structure comprising the GaN barrier layer as a first layer and the GaN barrier layer as the final layer, an Al$_{0.1}$Ga$_{0.9}$N clad layer 2 doped with 5 nm of Mg and a 200 nm thick Mg-doped Al$_{0.2}$Ga$_{0.98}$N layer 1.

A plan view of an electrode structure of the semiconductor light emitting device produced in this example is shown in FIG. 2. In the figure, 10 denotes an n-side electrode, 11 demotes an exposed face of a Si-doped GaN layer 6 for formation of an electrode, 12 denotes a p electrode bonding pad, and 13 denotes a translucent p electrode.

First, the substrate having a grown Si-doped GaN layer formed thereon was introduced into a MOCVD furnace.

Then, the temperature of the substrate temperature was raised to 1,000° C. under a condition in which the atmosphere inside the furnace was replaced by nitrogen, and stains adhered on the outermost surface of the Si—GaN layer were removed by sublimation. At the substrate temperature of 830° C. or higher, ammonia was circulated in the furnace.

After the substrate temperature was decreased to 740° C., while circulating ammonia as it is, a silane (SiH$_4$) gas, and steam of trimethyl indium (TMT) and triethyl gallium (TEG) generated by bubbling were circulated in the furnace to form a 20 nm thick Si-doped In$_{0.1}$Ga$_{0.9}$N clad layer 5. After switching valves of TMT, TEG and SiH$_4$, supply of these raw materials was terminated.

Subsequently, a multiple quantum well structure 20 comprising a barrier layer 3 made of GaN and a well layer 4 made of In$_{0.2}$G$_{0.8}$N was produced. In the production of the multiple quantum well structure, on a Si-doped In$_{0.1}$Ga$_{0.9}$N clad layer 5, a GaN barrier layer 3 was firstly formed and then an In$_{0.2}$Ga$_{0.8}$N well layer 4 was formed on the GaN barrier layer. After repeatedly laminated this structure five times, a sixth GaN barrier layer was formed on the fifth In$_{0.2}$Ga$_{0.8}$N well layer and then both sides of the multiple quantum well structure 20 were composed of the GaN barrier layer 3.

After the completion of the growth of the Si-doped $In_{0.2}Ga_{0.8}N$ clad layer 5, TEG was supplied into the furnace by switching a valve of TEG while maintaining the substrate temperature, the pressure in the furnace, and the flow rate and kind of a carrier gas, thereby growing a GaN barrier layer. As a result, a 16 nm thick GaN barrier layer 3 was formed.

After the completion of the growth of the GaN barrier layer, TEG and TMI were supplied in the furnace by switching valves of TEG and TMI while maintaining the substrate temperature, the pressure in the furnace, and the flow rate and kind of a carrier gas, thereby growing an $In_{0.2}Ga_{0.8}N$ well layer. As a result, a 3 nm thick $In_{0.2}Ga_{0.8}N$ well layer 4 was formed.

After the completion of the growth of the $In_{0.2}Ga_{0.8}N$ well layer, the GaN barrier layer was grown again. Such a procedure was repeated five times to form a 5-layered GaN barrier layer and a 5-layered $In_{0.2}Ga_{0.8}N$ well layer. Furthermore, a GaN barrier layer was formed on the final $In_{0.2}Ga_{0.8}N$ well layer.

A Mg-doped $In_{0.1}Ga_{0.9}N$ clad layer 2 was formed on the multiple quantum well structure 20 comprising the GaN barrier layer as the final layer using a MOCVD method.

First, the pressure in the furnace was adjusted to 200 mbar, the substrate temperature was adjusted to 1,020° C. and the carrier gas was changed to hydrogen from nitrogen and, after stabilization of the pressure and temperature in the furnace, supply of raw materials into the furnace was initiated by switching valves of TEG, TMA and biscyclopentadienyl magnesium ($Cp_2Mg$) and a Mg-doped $Al_{0.1}Ga_{0.9}N$ clad layer was grown to form a 5 nm thick Mg-doped $Al_{0.2}Ga_{0.8}N$ clad layer 2.

A Mg-doped $Al_{0.02}Ga_{0.98}N$ layer 1 was formed on the Mg-doped $Al_{0.1}Ga_{0.9}N$ clad layer.

While maintaining the temperature, pressure and carrier gas at the same conditions as in the case of the growth of the clad layer, supply of TMA, TMG and $Cp_2Mg$ into the furnace was initiated and the growth occurred. The flow rate of $Cp_2Mg$ was studied in advance and a hole concentration of a Mg-doped $Al_{0.02}Ga_{0.98}N$ contact layer was adjusted to $8 \times 10^{17}$ $cm^{-3}$ to form a 200 nm thick Mg-doped $Al_{0.02}Ga_{0.98}N$ layer 1.

After the completion of the growth of the Mg-doped $Al_{0.02}Ga_{0.98}N$ layer, heating was terminated and the temperature of the substrate was decreased to room temperature over 20 minutes. Immediately before the completion of the growth, the flow rate of $NH_3$ was decreased to ⅕₀ and the carrier was changed to nitrogen from hydrogen. Then, supply of $NH_3$ was completely terminated at 950° C.

After confirming that the substrate temperature was decreased to room temperature, the wafer was taken out into atmospheric air.

By the above procedure, an epitaxial wafer having a layer structure for a semiconductor light emitting device was produced. Herein, a Mg-doped $Al0_{0.02}Ga_{0.98}N$ layer 1 showed p-type without performing an annealing treatment for activating a p-type carrier.

Using an epitaxial wafer in which an epitaxial layer structure is laminated on the above sapphire substrate, a light emitting diode as a kind of a semiconductor light emitting device was produced. A p electrode bonding pad 12 and a transparent p electrode 13 made of ITO were formed on the surface of a Mg-doped $Al_{0.02}Ga_{0.98}N$ layer on the obtained wafer. The p electrode bonding pad 12 was laminated sequentially of titanium, aluminum and gold. The layers were formed thereon using a known photolithographic technique to thus obtain a p-side electrode. Furthermore, the wafer was dry-etched thereby exposing a portion 11 constituting an n-side electrode of the Si-doped GaN layer, and then an n-side electrode 10 comprising four layers made of Ni, Al, Ti and Au was produced on the exposed portion. By these operations, an electrode having a shape shown in FIG. 2 was produced on the wafer.

With respect to the wafer on which p-side and n-side electrodes are formed, the back surface of the sapphire substrate was ground and polished to obtain a mirror finished surface. The wafer was cut into square chips of 350 μm sides, placed on a lead frame so that the electrode faces upside, followed by connection to the lead frame using a gold wire to obtain a light emitting device. A forward electric current was applied between p-side and n-side electrodes of the light emitting diode thus obtained. As a result, a forward voltage at an electric current of 20 mA was 3.0 V. Light emission was observed through the p-side translucent electrode. As a result, the emission wavelength was 470 nm and the radiant power output was 15 mW. Characteristics of the light emitting diode were free from variation with respect to the light emitting diode produced from nearly the entire wafer.

Example 4

In this example, on a sapphire c-face substrate, a buffer layer, a GaN underlying layer and a Si-doped n-contact layer were formed by a sputtering method using the same chamber as in Example 3, and an n-clad layer and a light-emissive layer were formed by a MOCVD method, and then a clad layer and a p-contact layer were formed thereon by a sputtering method.

The apparatus used in Example 4 includes three sputtering chambers and one MOCVD apparatus.

First, up to the process for deposition of the light-emissive layer, each layer was formed by the same type chamber as in Example 3. Then, the wafer was transported to the third sputtering chamber and a p-type clad layer and a p-type contact layer were formed.

The sputtering system used for forming the p-type clad layer and the p-type contact layer comprises a high-frequency type power supply, and also includes a rotary Ga target, a Mg target and an Al target in the chamber. In the Ga target, piping for circulation of a refrigerant was disposed and refrigerant cooled to 20° C. was circulated in the piping thereby preventing fusion of Ga by heat. The surface of the Al target and the Mg target was designed to about ⅒ and ¹⁄₁₀₀ when compared with the Al target.

After argon and nitrogen gas were introduced, the substrate temperature was raised to 1,000° C. High-frequency bias of 2,000 W was applied to the metal Ga target side, bias of 200 W was applied to the Mg target, and bias of 1,400 W of bias was applied to the Al target during deposition of a clad layer and 50 W of bias was applied to the Al target during deposition of a contact layer, and then a layer of Mg-doped AlGaN was formed on the substrate under the conditions of circulation of Ar gas at 5 sccm and nitrogen gas at 15 sccm (proportion of nitrogen based on the entire gas: 75%) while maintaining a pressure in the furnace at 0.5 Pa. The growth rate was about 1 nm/s.

After deposition of a 10 nm thick Mg-doped AlGaN clad layer and a 200 nm Mg-doped AlGaN layer, supply of plasma was terminated and the wafer was removed out of the apparatus via a load lock chamber.

The wafer thus produced was converted into a light emitting diode chip in the same manner as in Example 3. A forward electric current was applied between electrodes. As a result, a forward voltage at an electric current of 20 mA was 3.1 V. Light emission was observed through the p-side translucent electrode. As a result, the emission wavelength was 460 nm and the radiant power output was 13 mW. Characteristics of the light emitting diode were free from variation with respect to the light emitting diode produced from nearly the entire wafer.

Example 5

In this example, on a sapphire c-face substrate, a buffer layer, a GaN underlying layer (a MOCVD method is used in the region right over the buffer layer) and a Si-doped n-contact layer were formed by a sputtering method using the same chamber as in Example 3, an n-clad layer and a light-emissive layer were formed by a MOCVD method, and a p-clad layer and p-contact layer were formed by a sputtering method.

The wafer thus produced was converted into a light emitting diode chip in the same manner as in Example 4. A forward electric current was applied between electrodes. As a result, a forward voltage at an electric current of 20 mA was 3.1 V. Light emission was observed through the p-side translucent electrode. As a result, the emission wavelength was 525 nm and the radiant power output was 7.5 mW. Characteristics of the light emitting diode were free from variation with respect to the light emitting diode produced from nearly the entire wafer.

INDUSTRIAL APPLICABILITY

The III group nitride compound semiconductor laminated structure obtained by the method of the present invention has a laminated structure composed of a III group nitride compound semiconductor crystal having good crystallinity, and also employs a production process having excellent throughput. Therefore, light emitting and laser diodes having excellent characteristics, or semiconductor devices such as an electronic device can be efficiently produced.

TABLE OF NUMERICAL REFERENCE

1: Mg-doped $Al_{0.02}Ga_{0.98}N$ layer
2: Mg-doped $Al_{0.1}Ga_{0.9}N$ clad layer
3: GaN barrier layer
4: $IN_{0.2}Ga_{0.8}N$ well layer
5: $IN_{0.1}Ga_{0.9}N$ clad layer
6: Si-doped n-type GaN layer
7: Undoped GaN layer (Second layer)
8: AlN layer composed of aggregate of columnar crystal (First layer)
9: Substrate
10: n-side electrode
11: Portion constituting n-side electrode of Si-doped GaN layer
12: p electrode bonding pad
13: Translucent p electrode
20: Multiple quantum well structure

The invention claimed is:
1. A deposition method of a multilayered structure composed of a III group nitride compound semiconductor on a substrate, characterized in that:
the multilayered structure comprises at least a buffer layer formed on a surface of the substrate, and an underlying layer formed on a surface of the buffer layer,
the buffer layer and the underlying layer are laminated by a sputtering method, and
a deposition temperature of the buffer layer is adjusted to a temperature lower than a deposition temperature of the underlying layer
wherein a ratio of a nitrogen flow rate to a flow rate of nitrogen and argon is from 75% to 100% during deposition of the underlying layer.
2. The deposition method of a III group nitride compound semiconductor laminated structure according to claim 1, wherein the buffer layer contains Al.
3. The deposition method of a III group nitride compound semiconductor laminated structure according to claim 2, wherein the buffer layer is formed of AlN.
4. The deposition method of a III group nitride compound semiconductor laminated structure according to claim 2, wherein the buffer layer is formed of an aggregate of a columnar crystal.
5. The deposition method of a III group nitride compound semiconductor laminated structure according to claim 2, wherein at least 60% of the substrate is coated with the buffer layer.
6. The deposition method of a III group nitride compound semiconductor laminated structure according to claim 2, wherein the buffer layer has a thickness of 20 to 100 nm.
7. The deposition method of a III group nitride compound semiconductor laminated structure according to claim 1, wherein the underlying layer contains Ga.
8. The deposition method of a III group nitride compound semiconductor laminated structure according to claim 7, wherein the underlying layer is formed of GaN.
9. The deposition method of a III group nitride compound semiconductor laminated structure according to claim 1, wherein the buffer layer is formed of AlN and the underlying layer is formed of GaN.
10. The deposition method of a III group nitride compound semiconductor laminated structure according to claim 1, wherein the buffer layer has a deposition temperature of room temperature to 800° C.
11. The deposition method of a III group nitride compound semiconductor laminated structure according to claim 1, wherein the underlying layer has a deposition temperature of 300 to 1,500° C.
12. The deposition method of a III group nitride compound semiconductor laminated structure according to claim 1, wherein a difference in the deposition temperature between the buffer layer and the underlying layer is 100° C. or higher.

* * * * *